United States Patent
Yang et al.

(10) Patent No.: US 11,289,651 B2
(45) Date of Patent: Mar. 29, 2022

(54) MEMORY DEVICE HAVING VIA LANDING PROTECTION

(71) Applicant: Taiwan Semiconductor Manufacturing Co., Ltd., Hsin-Chu (TW)

(72) Inventors: Tsung-Hsueh Yang, Taichung (TW); Shih-Chang Liu, Alian Township (TW); Yuan-Tai Tseng, Zhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 203 days.

(21) Appl. No.: 15/694,297

(22) Filed: Sep. 1, 2017

(65) Prior Publication Data

US 2019/0074440 A1  Mar. 7, 2019

(51) Int. Cl.
*H01L 45/00* (2006.01)
*H01L 43/02* (2006.01)
*H01L 43/08* (2006.01)
*H01L 43/12* (2006.01)
*H01L 27/22* (2006.01)
*H01L 27/24* (2006.01)

(52) U.S. Cl.
CPC ......... *H01L 45/1675* (2013.01); *H01L 43/02* (2013.01); *H01L 43/08* (2013.01); *H01L 43/12* (2013.01); *H01L 45/085* (2013.01); *H01L 45/1233* (2013.01); *H01L 45/1253* (2013.01); *H01L 45/146* (2013.01); *H01L 27/228* (2013.01); *H01L 27/2436* (2013.01)

(58) Field of Classification Search
CPC ..... H01L 45/1675; H01L 43/02; H01L 43/08; H01L 43/12; H01L 45/085; H01L 45/1233; H01L 45/1253; H01L 45/146; H01L 27/228; H01L 27/2436
See application file for complete search history.

(56) References Cited

U.S. PATENT DOCUMENTS 6,245,669 B1 * 6/2001 Fu ................... H01L 21/0276
                                                              257/E21.029
8,872,149 B1 * 10/2014 Hsieh ................. H01L 45/12
                                                                    257/2

(Continued)

OTHER PUBLICATIONS

"Bisect." Merriam-Webster.com Dictionary, Merriam-Webster, https://www.merriam-webster.com/dictionary/bisect. Accessed Jun. 4, 2021. (Year: 2021).*

(Continued)

*Primary Examiner* — Allen L Parker
*Assistant Examiner* — Charles N Ausar-El
(74) *Attorney, Agent, or Firm* — Eschweiler & Potashnik, LLC

(57) ABSTRACT

A memory cell with a hard mask and a sidewall spacer of different material is provided. The memory cell comprises a bottom electrode disposed over a substrate. A switching dielectric is disposed over the bottom electrode and having a variable resistance. A top electrode is disposed over the switching dielectric. A hard mask disposed over the top electrode. A sidewall spacer extends upwardly along sidewalls of the switching dielectric, the top electrode, and the hard mask. The hard mask and the sidewall spacer have different etch selectivity. A method for manufacturing the memory cell is also provided.

20 Claims, 8 Drawing Sheets

(56) References Cited

U.S. PATENT DOCUMENTS

| | | | |
|---|---|---|---|
| 9,172,036 B2* | 10/2015 | Chen | H01L 45/1253 |
| 9,431,603 B1* | 8/2016 | Hsieh | H01L 45/1233 |
| 9,431,609 B2* | 8/2016 | Dang | H01L 45/08 |
| 9,461,245 B1* | 10/2016 | Yang | H01L 45/1253 |
| 9,564,577 B1* | 2/2017 | Hsu | H01L 43/02 |
| 9,647,207 B2* | 5/2017 | Trinh | H01L 45/08 |
| 9,653,682 B1* | 5/2017 | Chou | H01L 27/2436 |
| 9,728,719 B2* | 8/2017 | Liu | H01L 45/1253 |
| 9,847,473 B2* | 12/2017 | Hsu | H01L 43/08 |
| 10,199,566 B2* | 2/2019 | Oh | H01L 43/02 |
| 10,270,025 B2* | 4/2019 | Chuang | H01L 43/02 |
| 2006/0054950 A1* | 3/2006 | Baek | H01L 45/146 |
| | | | 257/295 |
| 2014/0042567 A1* | 2/2014 | Jung | H01L 43/08 |
| | | | 257/421 |
| 2014/0131654 A1* | 5/2014 | Tu | H01L 45/04 |
| | | | 257/4 |
| 2015/0061052 A1* | 3/2015 | Huang | H01L 43/08 |
| | | | 257/421 |
| 2015/0295172 A1* | 10/2015 | Sung | H01L 45/1253 |
| | | | 257/2 |
| 2016/0049584 A1* | 2/2016 | Dang | H01L 45/147 |
| | | | 257/4 |
| 2016/0218283 A1* | 7/2016 | Trinh | H01L 45/1675 |
| 2016/0268505 A1* | 9/2016 | Sung | H01L 45/146 |
| 2016/0276586 A1* | 9/2016 | Trinh | H01L 45/1675 |
| 2016/0365512 A1* | 12/2016 | Sung | H01L 45/147 |
| 2016/0365513 A1* | 12/2016 | Sung | H01L 43/12 |
| 2016/0380183 A1* | 12/2016 | Chuang | H01L 43/12 |
| | | | 257/421 |
| 2017/0117467 A1* | 4/2017 | Chang | H01L 45/16 |
| 2017/0141305 A1* | 5/2017 | Yang | H01L 45/1253 |
| 2017/0162787 A1* | 6/2017 | Dang | H01L 45/1616 |
| 2017/0309682 A1* | 10/2017 | Chou | H01L 27/2463 |

OTHER PUBLICATIONS

Bisect | Origin and meaning of bisect by Online Etymology Dictionary; https://www.etymonline.com/word/bisect (Year: 2021).*

* cited by examiner

MEMORY DEVICE HAVING VIA LANDING PROTECTION

BACKGROUND

Many modern day electronic devices contain electronic memory. Electronic memory may be volatile memory or non-volatile memory. Non-volatile memory is able to store data in the absence of power, whereas volatile memory is not. Non-volatile memory such as magnetoresistive random-access memory (MRAM) and resistive random access memory (RRAM) are promising candidates for next generation non-volatile memory technology due to relative simple structures and their compatibility with complementary metal-oxide-semiconductor (CMOS) logic fabrication processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
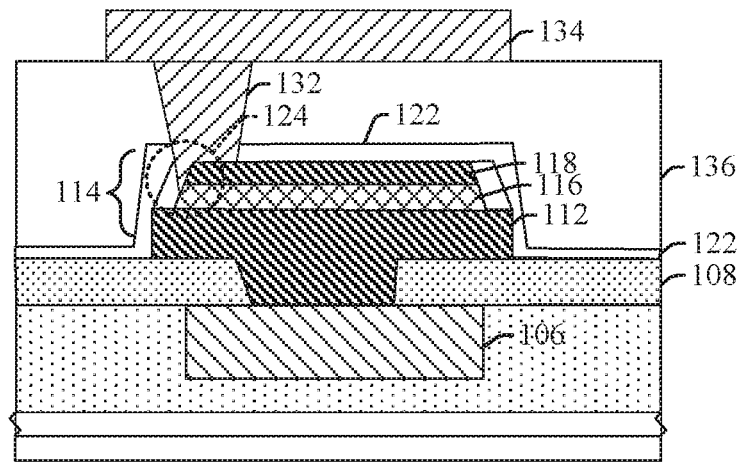
FIGS. 1A-1B illustrate a cross-sectional view of some embodiments of a memory cell with a hard mask and a sidewall spacer.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Moreover, "first", "second", "third", etc. may be used herein for ease of description to distinguish between different elements of a figure or a series of figures. "First", "second", "third", etc. are not intended to be descriptive of the corresponding element. Therefore, "a first dielectric layer" described in connection with a first figure may not necessarily corresponding to a "first dielectric layer" described in connection with another figure.

Referring to FIG. 1A, a memory cell 114 includes a top electrode 118 and a bottom electrode 112 separated by a switching dielectric 116. Depending on a voltage applied to the pair of electrodes, the switching dielectric 116 will undergo a reversible change between a high resistance state associated with a first data state (e.g., a '0' or 'RESET') and a low resistance state associated with a second data state (e.g., a '1' or 'SET'). The memory cell 114 is compatible with complementary metal-oxide-semiconductor (CMOS) logic fabrication processes and can be inserted between a top metallization line 134 and a bottom metallization line 106 for data storage and transmission. The top electrode 118 of the memory cell 114 is coupled to the top metallization line 134 through a top electrode via 132. The process to form the top electrode via 132 introduces contact challenges: the top electrode 118 and the switching dielectric 116 may be shorted when landing the top electrode via 132 on the top electrode 118. In more detail, an upper dielectric layer 122 and a dielectric layer 136 are formed overlying the top electrode 118, the switching dielectric 116, and the bottom electrode 112. Then a patterning process is applied to form an opening through the dielectric layer 136 and the upper dielectric layer 122 to expose the top electrode 118 for top electrode via filling and landing. The opening may be shifted to an edge of the top electrode 118 and may expose sidewalls of the top electrode 118 and the switching dielectric 116, as shown by a dotted line circle 124. As a result, the top electrode 118 and the switching dielectric 116 may be shorted by the top electrode via 132.

In some advanced embodiments, the present application is related to an improved memory device having a via landing protection structure including a sidewall spacer and a hard mask made of different material, and corresponding manufacturing methods. In some embodiments, referring to FIG. 1B, a memory cell 114 comprises a bottom electrode 112 disposed over a substrate 102. A switching dielectric 116 is disposed over the bottom electrode 112 and having a variable resistance. A top electrode 118 is disposed over the switching dielectric 116. A hard mask 120 is disposed over the top electrode 118. A sidewall spacer 126 is disposed on an upper surface of the bottom electrode 112 and extended upwardly along sidewalls of the switching dielectric 116, the top electrode 118, and the hard mask 120. The hard mask 120 and the sidewall spacer 126 comprise different materials or have distinct etch selectivity with respect to an etchant. Thereby, when forming the opening for top electrode via filling, an etching process can be applied that is highly selective to the hard mask 120 over the sidewall spacer 126, such that the sidewall spacer 126 can be retained and provide via landing protection for the memory cell 114. The hard mask 120 and the sidewall spacer 126 provide protection to the top electrode 118, such that an upper dielectric layer similar to the upper dielectric layer 122 of FIG. 1A can be eliminated and the fabrication process is simplified.

Figure 1B:
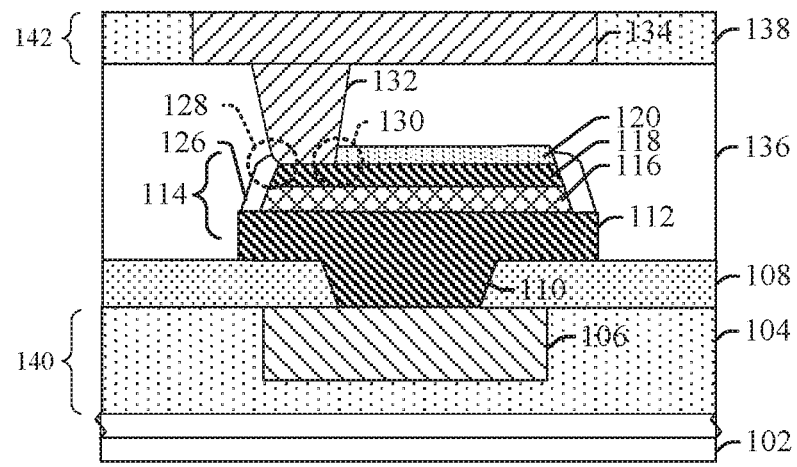

According to some embodiments, the memory cell 114 shown in FIG. 1B may be inserted within a back-end-of-line (BEOL) metallization stack having a lower interconnect structure 140 and an upper interconnect structure 142 arranged over a substrate 102. The lower interconnect structure 140 includes a bottom metallization line 106 disposed within a bottom interlayer dielectric layer 104. The upper interconnect structure 142 includes a top metallization line 134 disposed within a top interlayer dielectric layer 138. The bottom interlayer dielectric layer 104 and the top interlayer dielectric layer 138 may be, for example, an oxide, a low-k dielectric (i.e., a dielectric with a dielectric constant k less than silicon dioxide) or an extreme low-k dielectric (a dielectric with a dielectric constant k less than about 2), and the bottom metallization lines 106 and the top metallization lines 134 may be, for example, a metal, such as copper.

The memory cell 114 comprises a bottom electrode 112 arranged over the lower interconnect structure 140. The bottom electrode 112 may be a conductive material, such as titanium nitride. The bottom electrode 112 may also comprise, for example, titanium, tantalum, tantalum nitride, platinum, iridium, tungsten, ruthenium, or the like. In some embodiments, the bottom electrode 112 is electrically coupled to the bottom metallization line 106 of the lower interconnect structure 140 through a bottom electrode via 110 arranged between the bottom electrode 112 and the bottom metallization lines 106. The bottom electrode via 110 may be, for example, a conductive material, such as platinum, iridium, ruthenium or tungsten and may also function as a diffusion barrier layer to prevent material from diffusing between the bottom metallization lines 106 and the bottom electrode 112. The memory cell 114 further comprises a switching dielectric 116 arranged over the bottom electrode 112. In some embodiments, the memory cell 114 is a magnetoresistive random access memory (MRAM) cell and the resistance switching dielectric 116 can comprise a magnetic tunnel junction (MTJ) structure having a bottom ferromagnetic layer and a top ferromagnetic layer separated by a tunnel barrier layer. In some other embodiments, the memory cell 114 is a resistive random access memory (RRAM) cell and the resistance switching dielectric 116 can comprise a RRAM dielectric layer. The switching dielectric 116 may be a high-k layer (i.e., a layer with a dielectric constant k greater than 3.9), for example, tantalum oxide, tantalum hafnium oxide, tantalum aluminum oxide, or another material that includes tantalum, oxygen, and one or more other elements.

A top electrode 118 is arranged over the switching dielectric 116. In some embodiments, the top electrode 118 may comprise one or more metal or metal composition layers comprising, for example, titanium, titanium nitride, tantalum, tantalum nitride, or the like. In some embodiments, a thickness of the top electrode 118 is about greater than 2 to 3 times of a thickness of the switching dielectric 116. In some embodiments, the top electrode 118 is electrically coupled to the top metallization line 134 of the upper interconnect structure 142 through a top electrode via 132 arranged between the top electrode 118 and the top metallization line 134. The top electrode via 132 may be, for example, a conductive material, such as such as copper, aluminum, or tungsten. During operation of the memory cell 114, voltages are applied between the top electrode 118 and bottom electrode 112 to read, set, or erase the memory cell 114 by forming or breaking one or more conductive filaments of the switching dielectric 116. Thus the memory cell 114 can have a variable resistance in a comparatively low or high resistance state to stand for low or high bit status, for example.

In some embodiments, the memory cell 114 further comprises a hard mask 120 arranged over the top electrode 118. The hard mask 120 may be made of silicon carbide. The hard mask 120 may also comprises other dielectric materials, such as silicon dioxide or silicon nitride. The hard mask 120 may directly contacts the top electrode 118. In some embodiments, a sidewall spacer 126 is disposed on the bottom electrode 112 and surrounding and along sidewalls of the switching dielectric 116, the top electrode 118, and the hard mask 120. The sidewall spacer 126 protects the top electrode 118 and the switching dielectric 116 from shortage and is used during the manufacture of the memory cell 114 to define a foot print of the bottom electrode 112. The sidewall spacer 126 is made of a dielectric material different from that of the hard mask 120. The sidewall spacer 126 may comprise, for example, silicon nitride or a multilayer oxide-nitride-oxide film. In some embodiments, sidewalls of the bottom electrode 112 and the sidewall spacer 126 may be aligned or coplanar. Sidewalls of the hard mask 120, the top electrode 118, and the switching dielectric 116 may also be aligned or coplanar and be recessed back from that of the bottom electrode 112. In some embodiments, a top surface of the sidewall spacer 126 reaches and contacts the sidewall of the hard mask layer. The top surface of the sidewall spacer 126 is higher than that of the top electrode 118, such that an uppermost point of the sidewall spacer 126 reaches or is slightly lower than a top surface of the hard mask 120. At a bottom region of the top electrode via 132, the top electrode via 132 may be more inside tilted at one side closer to the sidewall spacer 126 than the other side closer to a center region of the hard mask 120, as shown by dotted circles 128, 130. The more inside titled bottom region structure may be a result of etching selectivity of the via opening etching process: the etchant may have a higher selectivity to the hard mask 120 than the sidewall spacer 126.

In some embodiments, a lower dielectric layer 108 is disposed surrounding the bottom electrode via 110. The lower dielectric layer 108 may comprise silicon carbide, silicon nitride, silicon oxide, or one or more layers of composite dielectric films, for example. A dielectric layer 136 is disposed over the lower dielectric layer 108. The dielectric layer 136 may comprise silicon oxide. The dielectric layer 136 may have a bottom surface directly contacts a top surface of the lower dielectric layer 108. The dielectric layer 136 may have a top surface directly contacts a bottom surface of the top interlayer dielectric layer 138. A top surface of the hard mask 120 may directly contact the dielectric layer 136. It is noted that the structure where the dielectric layer 136 directly contacts the lower dielectric layer 108 is different from the embodiments shown in FIG. 1A, where an upper dielectric layer 122 (referring to FIG. 1A) is disposed over the lower dielectric layer 108, continuously extends along sidewalls of the bottom electrode 112 and the sidewall spacer 126, and overlies a top surface of the top electrode 118. No upper dielectric layer similar to the upper dielectric layer 122 of FIG. 1A is presented in FIG. 1B, such that the dielectric layer 136 is formed on the lower dielectric layer 108, along sidewalls of the bottom electrode 112, the sidewall spacer 126, and the top electrode via 132, and overlying the hard mask 120. Such that device structure and corresponding manufacturing processes are simplified.

Figure 2:
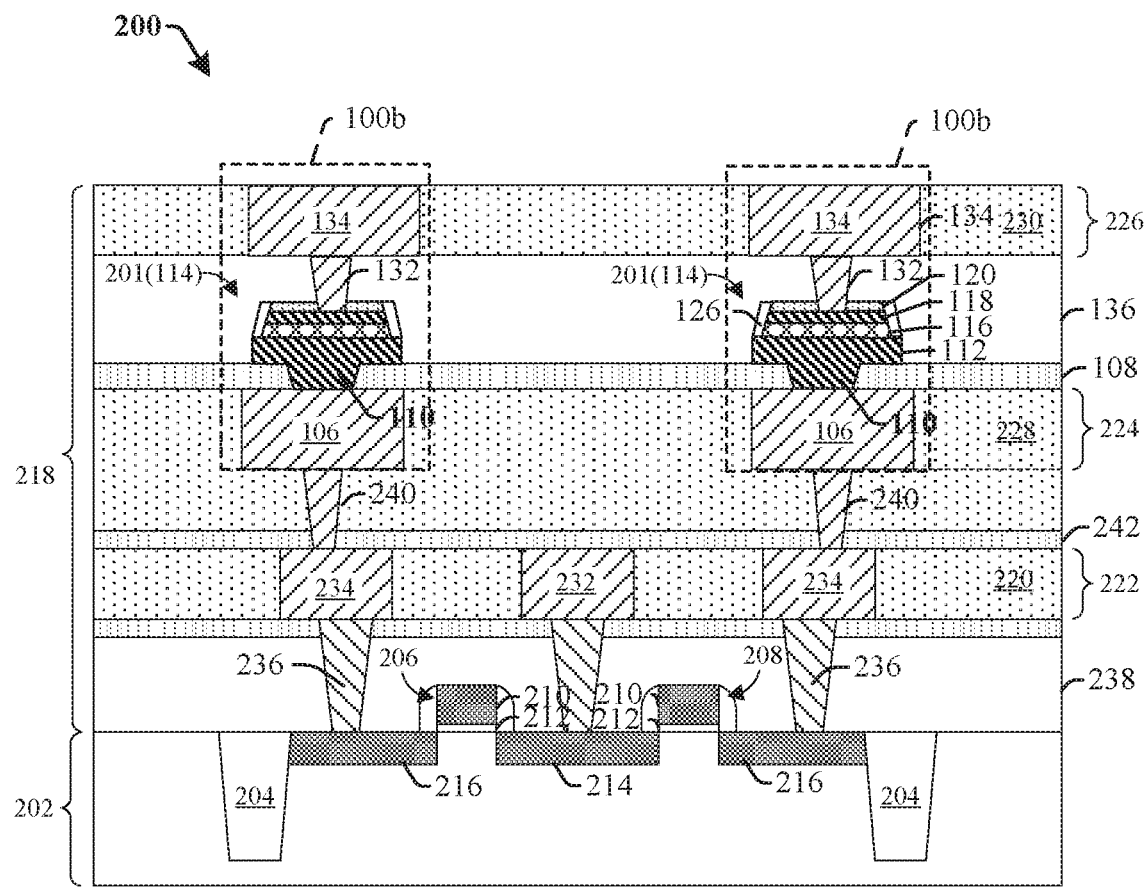
FIG. 2 illustrates a cross-sectional view of some embodiments of an integrated circuit with the memory cell of FIG. 1.

FIG. 2 illustrates a cross-sectional view of an integrated circuit device 200 including a memory cell 201 according to some additional embodiments. The memory cell 201 may have the same structure as the memory cell 114 shown in FIG. 1B and described above. As shown in FIG. 2, the memory cell 201 can be disposed over a substrate 202. The substrate 202 may be, for example, a bulk substrate (e.g., a bulk silicon substrate) or a silicon-on-insulator (SOI) substrate. One or more shallow trench isolation (STI) regions 204 or oxide-filled trenches are disposed in the substrate 202. A pair of word line transistors 206, 208 is spaced between the STI regions 204. The word line transistors 206, 208 extend parallel to each other, and include word line gates 210 separated from the substrate 202 by word line dielectric layers 212, and source/drain regions 214, 216. The source/drain regions 214, 216 are embedded within the surface of the substrate 202 between the word line gates 210 and the STI regions 204. The word line gates 210 may be, for example, doped polysilicon or a metal, such as titanium nitride or tantalum nitride. The word line dielectric layers 212 may be, for example, an oxide, such as silicon dioxide. A bottom-most ILD layer 238 is disposed overlying the word line transistors 206, 208. The bottom-most ILD layer 238 may be an oxide.

A back-end-of-line (BEOL) metallization stack 218 is arranged over the word line transistors 206, 208. The BEOL metallization stack 218 includes a plurality of metallization layers 222, 224, 226 respectively arranged within the interlayer dielectric layers 220, 228, 230. The metallization layers 222, 224, 226 may be, for example, a metal, such as copper or aluminum. The interlayer dielectric layers 220, 228, 230 may be, for example, a low κ dielectric, such as porous undoped silicate glass, or an oxide, such as silicon dioxide. Etch stop layers 108, 242 may be disposed to separate the interlayer dielectric layers 220, 228, 230. The metallization layers 222, 224, 226 include a source line 232 coupled to a source/drain region 214 shared by the word line transistors 206, 208. Further, the metallization layers 222, 224, 226 include a bit line 134 connected to the memory cell 201 and further connected to a source/drain region 216 of the word line transistor 206 or the work line transistor 208 through a plurality of metallization lines, such as metallization lines 106, 234, and a plurality of vias, such as vias 132, 110, 240. A contact 236 extends from the metallization line 234 through the bottom-most ILD layer 238 to reach the source/drain region 216. The vias 132, 110, 240 and the contact 236 may be, for example, a metal, such as copper, gold, or tungsten.

The memory cell 201 is inserted between a top metallization line 134 and a bottom metallization line 106. Similar as described above associated with FIG. 1B, the memory cell 201 comprises a bottom electrode 112 connecting or seamless contacting a bottom electrode via 110. A switching dielectric 116 is disposed over the bottom electrode 112. A top electrode 118 is disposed over the switching dielectric 116. A hard mask 120 is disposed over the top electrode 118. A sidewall spacer 126 is disposed on an upper surface of the bottom electrode 112 and extends upwardly along sidewalls of the switching dielectric 116, the top electrode 118, and the hard mask 120. The hard mask 120 and the sidewall spacer 126 have different etch selectivity, such that the sidewall spacer 126 can be retained to cover and protect the switching dielectric 116 when the hard mask 120 is etched through to expose the top electrode 118 an prepare for top electrode via filling. A dielectric layer 136 is disposed overlying the memory cell 201. The dielectric layer 136 may be an oxide. A top electrode via is disposed through the dielectric layer 136 and the hard mask 120 to connect the top electrode 118 to the top metallization line 134. Though the memory cell 201 is shown as inserted between the upper metallization layer 226 and the lower metallization layer 224 in FIG. 2, it is appreciated that the memory cell 201 can be inserted between any two of the metallization layers of the BEOL metallization stack 218.

FIGS. 3-12 illustrate some embodiments of cross-sectional views showing a method of forming an integrated circuit device.

Figure 3:
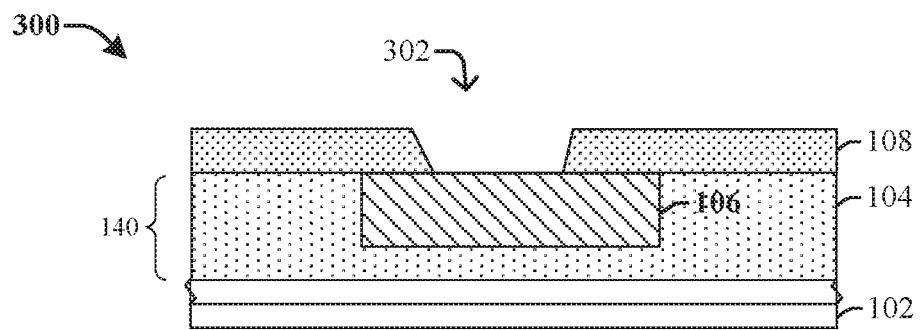
FIGS. 3-12 illustrate a series of cross-sectional views of some embodiments of an integrated circuit at various stages of manufacture, the integrated circuit including a memory cell.

As shown in cross-sectional view 300 of FIG. 3, a bottom via opening 302 is formed within a lower dielectric layer 108 overlying a lower interconnect structure 140. The lower interconnect structure 140 includes a bottom metallization line 106 laterally surrounded by a bottom interlayer dielectric layer 104. The bottom interlayer dielectric layer 104 may be, for example, a low-k dielectric, and the bottom metallization line 106 may be, for example, a metal, such as copper. The lower dielectric layer 108 is formed over the lower interconnect structure 140 with the bottom via opening 302 exposing the bottom metallization line 106. The lower dielectric layer 108 may be, for example, a dielectric, such as silicon dioxide or silicon nitride. The process for forming the bottom via opening 302 may include depositing the lower dielectric layer 108 over the lower interconnect structure 140 followed by a photolithography process. A photoresist layer may be formed over the lower dielectric layer 108 and exposing regions of lower dielectric layer 108 corresponding to the bottom via opening 302 to be formed. Then, one or more etchants selective of the lower dielectric layer 108 may be applied according to the photoresist layer. After applying the one or more etchants, the photoresist layer may be removed.

Figure 4:
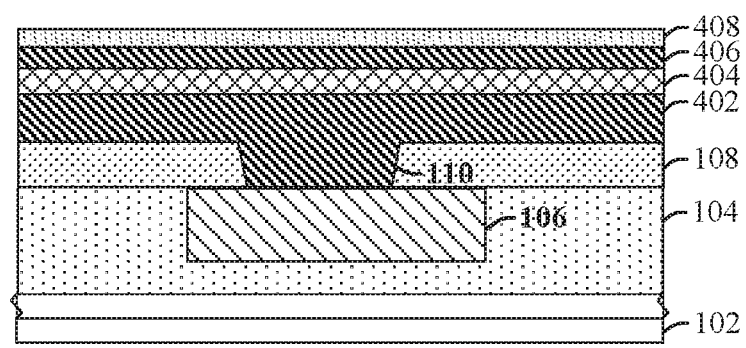

As shown in cross-sectional view 400 of FIG. 4, a multi-layer stack of a memory cell is deposited over the lower dielectric layer 108 by a series of vapor deposition techniques (e.g., physical vapor deposition, chemical vapor deposition, etc.). A bottom electrode via 110 is firstly formed over the lower dielectric layer 108 and filling the bottom via opening 302 (shown in FIG. 3). The bottom electrode via 110 may be, for example, formed of a conductive material, such as polysilicon, titanium nitride, tantalum nitride, platinum, gold, iridium, ruthenium, tungsten, or the like. For example, the bottom electrode via 110 may be a titanium nitride layer formed by an atomic layer deposition (ALD) process, followed by a planarization process. Then a bottom electrode layer 402 is formed over the bottom electrode via 110 and the lower dielectric layer 108. The bottom electrode layer 402 may be the same material as the bottom electrode via and may even be formed in one deposition process with the bottom electrode via 110. The bottom electrode layer 402 may be formed having a recess corresponding to the bottom electrode via 110. A planarization process may be subsequently performed to form a planar top surface for the bottom electrode layer 402. In some embodiments, the bottom electrode layer 402 may comprise a metal nitride (e.g., titanium nitride (TiN), tantalum nitride (TaN), or the like) and/or a metal (e.g., titanium (Ti), tantalum (Ta), or the like). Then a resistive switching layer 404 is formed over the planarized bottom electrode layer 402. In some embodiments, the resistive switching layer 404 may comprise a magnetic tunnel junction (MTJ) structure having a pinned magnetic layer and a free magnetic layer, which are vertically separated by a dielectric barrier layer. In other embodiments, the resistive switching layer 404 may comprise a RRAM dielectric data storage layer. In some embodiments, the resistive switching layer 404 may comprise a metal oxide composite such as hafnium aluminum oxide (HfAlO$_x$), zirconium oxide (ZrO$_x$), aluminum oxide (AlO$_x$), nickel oxide (NiO$_x$), tantalum oxide (TaO$_x$), or titanium oxide (TiO$_x$). A top electrode layer 406 is formed over the resistive switching layer 404. The top electrode layer 406 may comprise one or more conductive layers. In some embodiments, the top electrode layer 406 may comprise titanium nitride (TiN) or tantalum nitride (TaN), a metal (e.g., titanium (Ti) or tantalum (Ta) copper) etc. A hard mask layer 408 is formed over the top electrode layer 406. The hard mask layer 408 may comprise dielectric materials such as silicon carbide.

Figure 5:
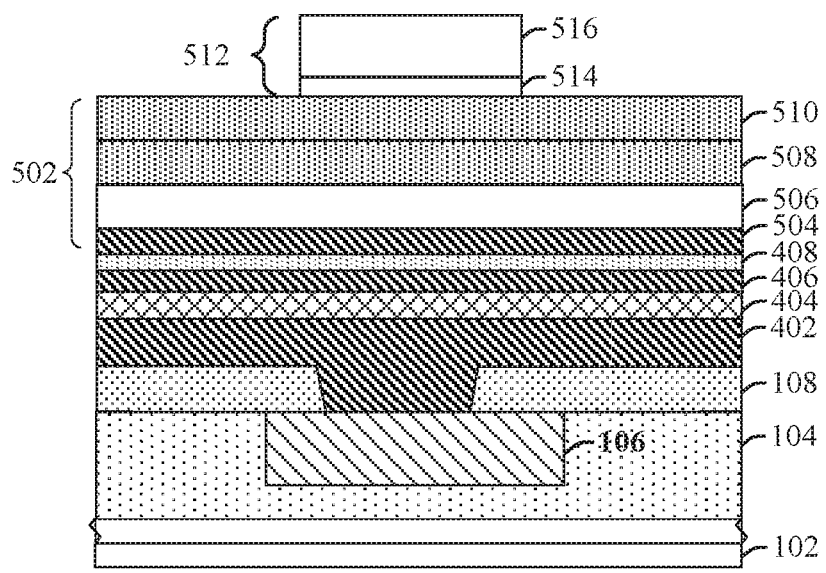

As shown in cross-sectional view 500 of FIG. 5, a multi-layer stack 502 of patterning layers is formed over the hard mask layer 408 for patterning the memory cell. A conductive layer 504 is formed over the hard mask layer 408. The conductive layer 504 may be comprised of titanium nitride (TiN) or tantalum nitride (TaN), a metal (e.g., titanium (Ti) or tantalum (Ta) copper) etc. The plurality of hard mask layers such as a second hard mask layer 506, a third hard mask layer 508, and a fourth hard mask layer 510 may be subsequently formed over the conductive layer 504. The plurality of hard mask layers may comprise one or more of an advanced pattern film (APF), silicon oxynitride (SiON), etc. At least one patterning layer 512 is formed over the multi-layer stack 502. The at least one patterning layer 512 may include a bottom antireflective coating (BARC) layer 514 and a photoresist layer 516 which has been spin-coated over the BARC layer 514 and patterned, for example, using a double-patterning technique.

Figure 6:
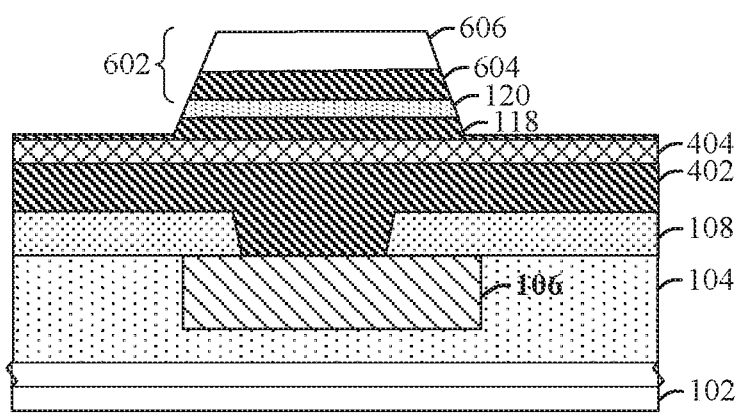

As shown in cross-sectional view 600 of FIG. 6, the top electrode layer 406 (shown in FIG. 5) is patterned to form a top electrode 118. The top electrode 118 is formed according to a hard mask 120, which is formed by patterning the hard mask layer 408 (shown in FIG. 5). The multi-layer stack 502 (shown in FIG. 5) is patterned layer by layer, and a patterning mask 602 is formed over the hard mask 120 as a result. As an example, the patterning mask 602 may comprise a conductive component 604 corresponding to the conductive layer 504 of FIG. 5 and a dielectric mask 606 corresponding to the second hard mask layer 506 of FIG. 5. The patterning mask 602 may also comprise more or fewer layers of the multi-layer stack 502 of FIG. 5. In some embodiments, the patterning mask 602, the hard mask 120 and the top electrode 118 may formed to have tilted sidewalls as the result of the patterning process. In some embodiments, the patterning process can comprise a dry etching process that may have an etchant chemistry including CF4, CH2F2, Cl2, BCl3 and/or other chemicals.

Figure 7:
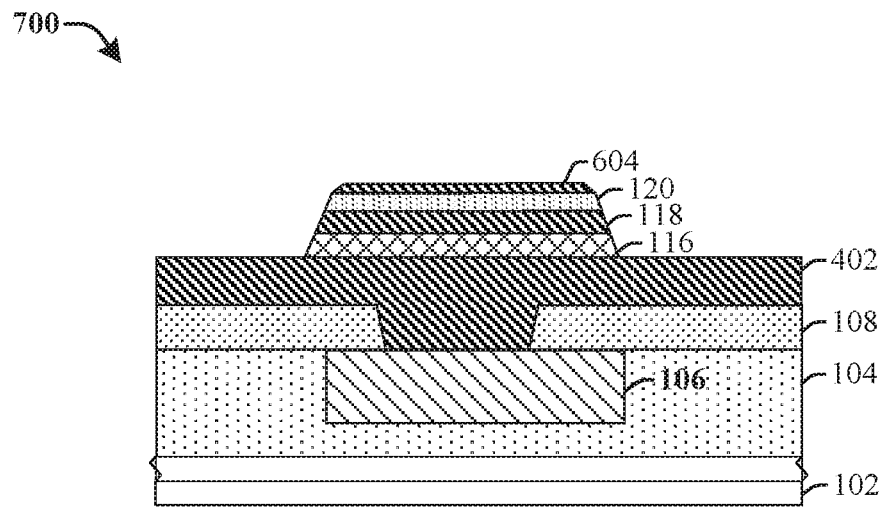

As shown in cross-sectional view 700 of FIG. 7, the resistive switching layer 404 (shown in FIG. 6) is patterned to form a switching dielectric 116 according to the top electrode 118 and the hard mask 120. During the patterning process, the patterning mask 602 (shown in FIG. 6) may be substantially removed or reduced. A thinned conductive component 604 may be left on the hard mask 120. The bottom electrode layer 402 may be exposed. In some embodiments, sidewalls of the switching dielectric 116 and the top electrode 118 can be tilted and aligned (e.g., co-planar). In some embodiments, the patterning process can comprise a dry etching process that may have an etchant chemistry including CF4, CH2F2, Cl2, BCl3 and/or other chemicals.

Figure 8:
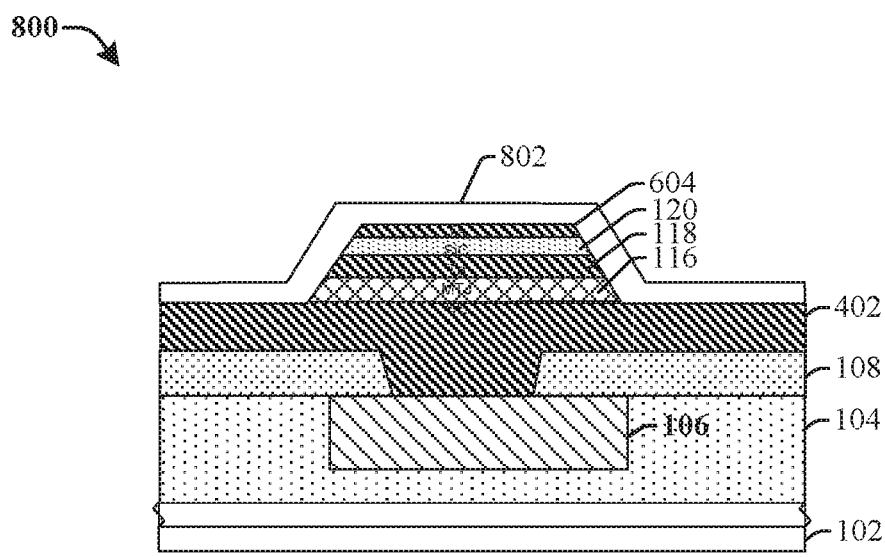

As shown in cross-sectional view 800 of FIG. 8, a dielectric spacer layer 802 is formed along an upper surface of the planarized bottom electrode layer 402, extending along sidewall surfaces of the switching dielectric 116, the top electrode 118, the hard mask 120, and the thinned conductive component 604, and covering a top surface of the thinned conductive component 604. The dielectric spacer layer 802 may comprise silicon nitride, tetraethyl orthosilicate (TEOS), silicon-rich oxide (SRO), or a similar composite dielectric film. In some embodiments, the dielectric spacer layer 802 may be formed by a vapor deposition technique (e.g., physical vapor deposition, chemical vapor deposition, etc.).

Figure 9:
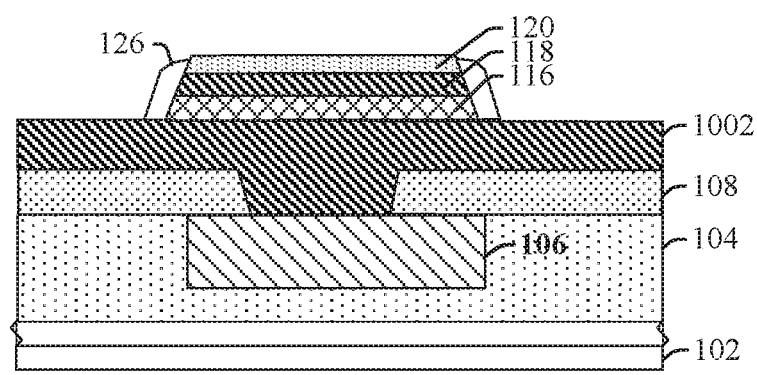

As shown in cross-sectional view 900 of FIG. 9, a sidewall spacer 126 is formed from the dielectric spacer layer 802 (shown in FIG. 8). The process for forming the sidewall spacer 126 may include performing an anisotropic etch (e.g. a vertical etch) to the dielectric spacer layer 802 to remove lateral stretches of the dielectric spacer layer 802, thereby resulting in the sidewall spacer 126 along the sidewall surfaces of the switching dielectric 116, the top electrode 118, the hard mask 120. The thinned conductive component 604 (shown in FIG. 8) may be removed during the etching process. As a result, the sidewall spacer 126 may have a top surface higher than that of the top electrode 118. The top surface of the sidewall spacer may be aligned or lower than a top surface of the hard mask 120.

Figure 10:
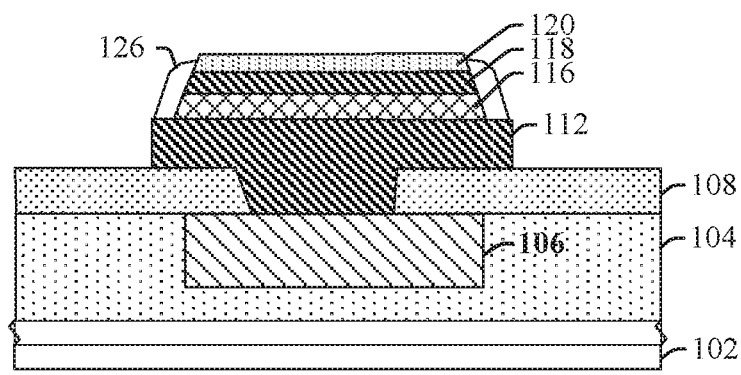

As shown in cross-sectional view 1000 of FIG. 10, an etch is performed to pattern and form a bottom electrode 112 according to the sidewall spacer 126 and the hard mask 120. The etch can comprise a dry etch such as a plasma etching process that may have an etchant chemistry including $CF_4$, $CH_2F_2$, $Cl_2$, $BCl_3$ and/or other chemicals.

Figure 11:
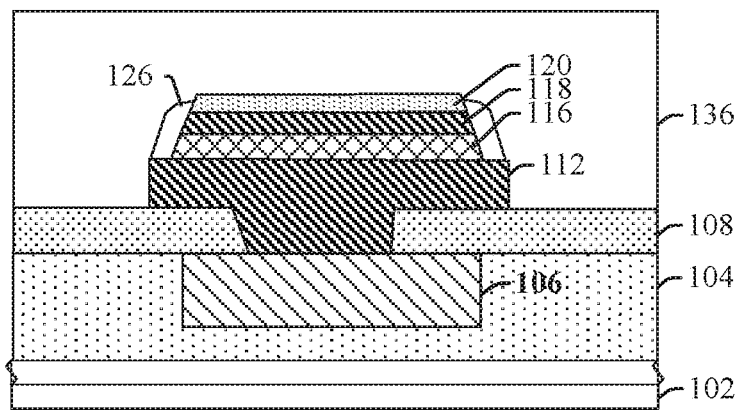

As shown in cross-sectional view 1100 of FIG. 11, a dielectric layer 136 is formed over and surrounding the memory cell. The dielectric layer 136 may be, for example, a low-k or an extreme low-k dielectric. In some embodiments, the process for forming the dielectric layer 136 includes depositing an intermediate interlayer dielectric layer and performing a chemical mechanical polish (CMP) into the intermediate interlayer dielectric layer to planarize the top surface of the intermediate interlayer dielectric layer.

Figure 12:
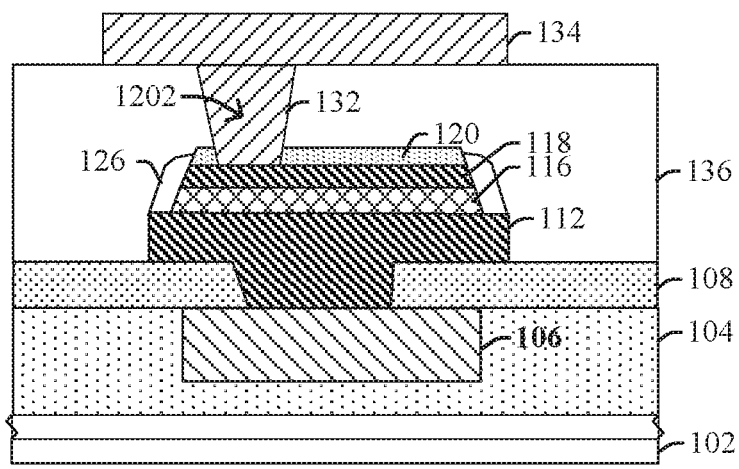

As shown in cross-sectional view 1200 of FIG. 12, a top electrode via opening 1202 is formed through the dielectric layer 136 and the hard mask 120 and reaches on the top electrode 118. The top electrode via opening 1202 is formed by an etching process using an etchant that is highly selective to the hard mask 120 relative to the sidewall spacer 126. In some embodiments, the etchant has an etching rate ratio for the hard mask and the sidewall spacer in a range of from 1:3 to 1:10. In a good alignment condition, the top electrode via opening 1202 is formed around a center region of the hard mask 120 and is away from an edge of the top electrode 118. In a less ideal alignment condition, such as shown in FIG. 1B, the etching process is stopped from reaching and exposing a sidewall of the switching dielectric 116 by the sidewall spacer 126. Thereby, the switching dielectric 116 and the top electrode 118 is protected from shorting by a subsequently filled conductive material. A conductive layer is then formed filling the top electrode via opening 1202 to form a top electrode via 132. The conductive layer may be, for example, a metal, such as copper or tungsten. The process for forming the conductive layer may include depositing an intermediate conductive layer filling the top electrode via opening 1202 and overhanging the dielectric layer 136 to form the top electrode via 132 and to form a top metallization line 134. Photolithography may then be used to pattern the conductive layer.

Figure 13:
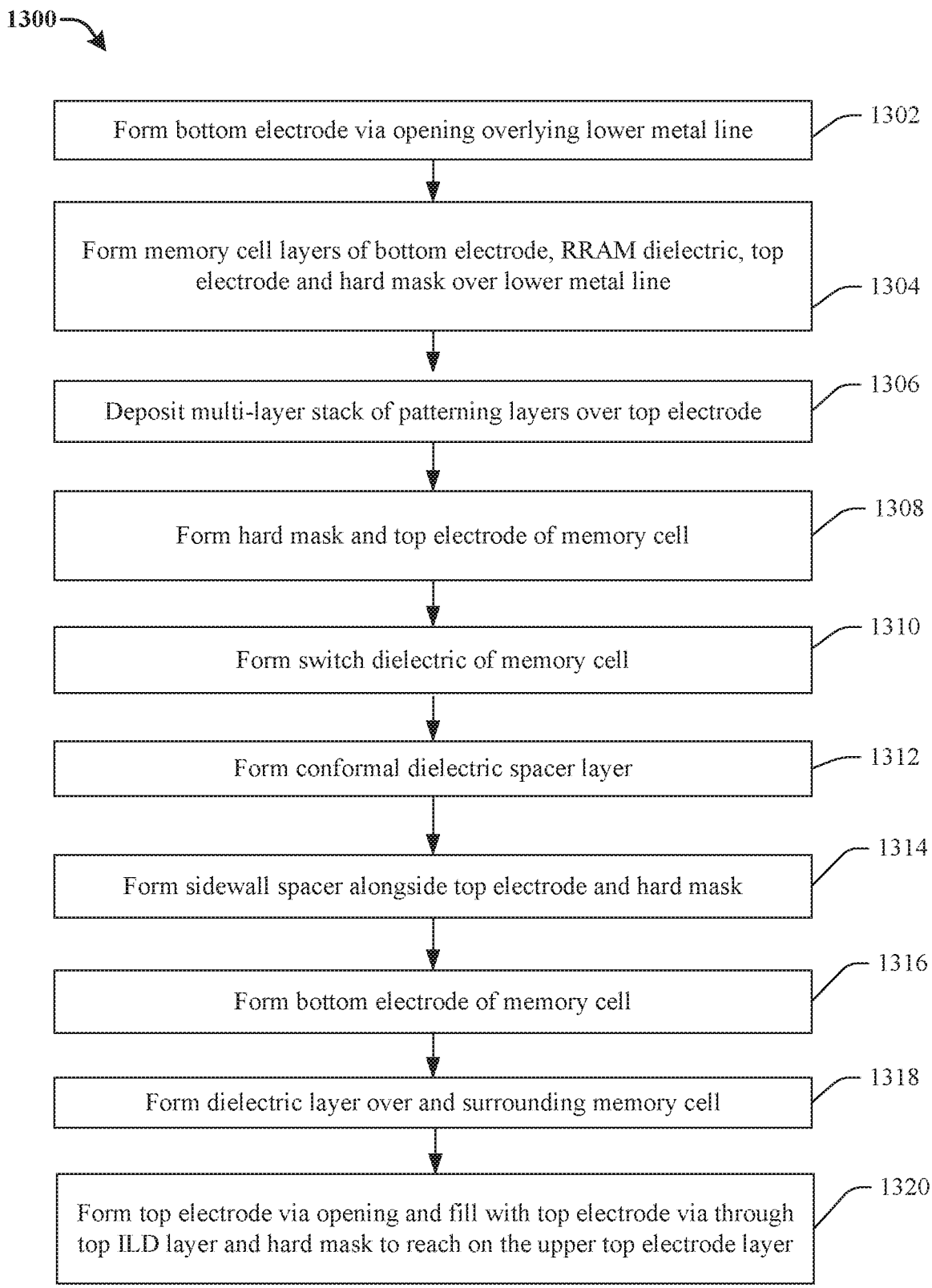
FIG. 13 illustrates a flow diagram of some embodiments of a method for manufacturing an integrated circuit with a memory cell.

FIG. 13 shows some embodiments of a flow diagram of a method 1300 of forming a memory device. Although method 1300 is described in relation to FIGS. 3-12, it will be appreciated that the method 1300 is not limited to such structures disclosed in FIGS. 3-12, but instead may stand alone independent of the structures disclosed in FIGS. 3-12. Similarly, it will be appreciated that the structures disclosed in FIGS. 3-12 are not limited to the method 1300, but instead may stand alone as structures independent of the method 1300. Also, while disclosed methods (e.g., method 1300) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1302, a bottom via opening is formed within a lower dielectric layer overlying a lower interconnect structure. The lower interconnect structure may comprise a bottom metallization line laterally surrounded by a bottom interlayer dielectric layer. The bottom via opening is formed through the lower dielectric layer to expose the bottom metallization line. FIG. 3 illustrates some embodiments of a cross-sectional view 300 corresponding to act 1302.

At 1304, a multi-layer stack is deposited over the lower dielectric layer by a series of vapor deposition techniques (e.g., physical vapor deposition, chemical vapor deposition, etc.). A bottom electrode via is firstly formed over the lower dielectric layer and filling the bottom via opening. The bottom electrode via may be a titanium nitride layer formed by an atomic layer deposition (ALD) process, followed by a planarization process. Then, a bottom electrode layer, a resistive switching layer, a top electrode layer, and a hard mask layer are subsequently formed over the bottom electrode via and the lower dielectric layer. In some embodiments, the bottom electrode layer 402 may comprise a metal nitride (e.g., titanium nitride (TiN), tantalum nitride (TaN), or the like) and/or a metal (e.g., titanium (Ti), tantalum (Ta), or the like). In some embodiments, the resistive switching layer may comprise a magnetic tunnel junction (MTJ) structure having a pinned magnetic layer and a free magnetic layer, which are vertically separated by a dielectric barrier layer. In other embodiments, the resistive switching layer may comprise a RRAM dielectric data storage layer. In some embodiments, the top electrode layer may comprise titanium nitride (TiN) or tantalum nitride (TaN), a metal (e.g., titanium (Ti) or tantalum (Ta) copper) etc. The hard mask layer may comprise dielectric materials such as silicon carbide. FIG. 4 illustrates some embodiments of a cross-sectional view 400 corresponding to act 1304.

At 1306, a multi-layer stack of patterning layers is formed over the hard mask layer for patterning the memory cell. The multi-layer stack may comprise a conductive layer and a plurality of hard mask layers formed over the conductive layer, including a second hard mask layer, a third hard mask layer, and a fourth hard mask layer. The conductive layer may comprise titanium nitride (TiN) or tantalum nitride (TaN), a metal (e.g., titanium (Ti) or tantalum (Ta) copper) etc. The plurality of hard mask layers may comprise one or more of an advanced pattern film (APF), silicon oxynitride (SiON), etc. A bottom antireflective coating (BARC) layer and a photoresist layer are formed and patterned over the plurality of hard mask layers. FIG. 5 illustrates some embodiments of a cross-sectional view 500 corresponding to act 1306.

At 1308, the multi-layer stack is patterned layer by layer, and a patterning mask is formed over the hard mask layer as a result. Then a hard mask is formed by patterning the hard mask layer. A top electrode is formed according to the hard mask. In some embodiments, the patterning mask, the hard mask and the top electrode may form to have tilted sidewalls as the result of the patterning process. In some embodiments, the patterning process can comprise a dry etching process that may have an etchant chemistry including CF4, CH2F2, Cl2, BCl3 and/or other chemicals. FIG. 6 illustrates some embodiments of a cross-sectional view 600 corresponding to act 1308.

At 1310, the resistive switching layer is patterned to form a switching dielectric according to the top electrode and the hard mask. During the patterning process, the patterning mask may be substantially removed or reduced. A thinned conductive component may be left on the hard mask. The bottom electrode layer may be exposed. In some embodiments, sidewalls of the switching dielectric and the top electrode can be tilted and aligned (e.g., co-planar). In some embodiments, the patterning process can comprise a dry etching process that may have an etchant chemistry including CF4, CH2F2, Cl2, BCl3 and/or other chemicals. FIG. 7 illustrates some embodiments of a cross-sectional view 700 corresponding to act 1310.

At 1312, a dielectric spacer layer is formed along an upper surface of the bottom electrode layer, extending along sidewall surfaces of the switching dielectric, the top electrode, the hard mask, and the thinned conductive component, and covering a top surface of the thinned conductive component. The dielectric spacer layer may comprise silicon nitride, tetraethyl orthosilicate (TEOS), silicon-rich oxide (SRO), or a similar composite dielectric film. In some embodiments, the dielectric spacer layer may be a conformal layer and may be formed by a vapor deposition technique (e.g., physical vapor deposition, chemical vapor deposition, etc.). FIG. 8 illustrates some embodiments of a cross-sectional view 800 corresponding to act 1312.

At 1314, a sidewall spacer is formed from the dielectric spacer layer. The process for forming the sidewall spacer may include performing an anisotropic etch (e.g. a vertical etch) to the dielectric spacer layer to remove lateral stretches of the dielectric spacer layer, thereby resulting in the sidewall spacer along the sidewall surfaces of the switching dielectric, the top electrode, the hard mask. The thinned conductive component may be removed during the etching process. As a result, the sidewall spacer may have a top surface higher than that of the top electrode. The top surface of the sidewall spacer may be aligned or lower than a top surface of the hard mask. FIG. 9 illustrates some embodiments of a cross-sectional view 900 corresponding to act 1314.

At 1316, an etch is performed to pattern and form a bottom electrode according to the sidewall spacer and the hard mask. The etch can comprise a dry etch such as a plasma etching process that may have an etchant chemistry including CF4, CH2F2, Cl2, BCl3 and/or other chemicals. FIG. 10 illustrates some embodiments of a cross-sectional view 1000 corresponding to act 1316.

At 1318, a dielectric layer is formed over and surrounding the memory cell. The dielectric layer may be, for example, a low-k or an extreme low-k dielectric. In some embodiments, the process for forming the dielectric layer 136 includes depositing an intermediate interlayer dielectric layer and performing a chemical mechanical polish (CMP) into the intermediate interlayer dielectric layer to planarize the top surface of the intermediate interlayer dielectric layer. FIG. 11 illustrates some embodiments of a cross-sectional view 1100 corresponding to act 1318.

At 1320, a top electrode via opening is formed through the dielectric layer and the hard mask and reach on the top electrode. A conductive layer is formed filling the top electrode via opening to form a top electrode via, and overhanging the dielectric layer to form a top metallization line. The conductive layer may be, for example, a metal, such as copper or tungsten. The process for forming the conductive layer may include depositing an intermediate conductive layer over the remaining dielectric layer and filling the top electrode via opening. Photolithography may then be used to pattern the conductive layer. FIG. 12 illustrates some embodiments of a cross-sectional view 1200 corresponding to act 1320.

It will be appreciated that while reference is made throughout this document to exemplary structures in discussing aspects of methodologies described herein that those methodologies are not to be limited by the corresponding structures presented. Rather, the methodologies (and structures) are to be considered independent of one another and able to stand alone and be practiced without regard to any of the particular aspects depicted in the FIGS. Additionally, layers described herein, can be formed in any suitable manner, such as with spin on, sputtering, growth and/or deposition techniques, etc.

Also, equivalent alterations and/or modifications may occur to those skilled in the art based upon a reading and/or understanding of the specification and annexed drawings. The disclosure herein includes such modifications and alterations and is generally not intended to be limited thereby. For example, although the figures provided herein are illustrated and described to have a particular doping type, it will be appreciated that alternative doping types may be utilized as will be appreciated by one of ordinary skill in the art.

Thus, as can be appreciated from above, the present disclosure provides a memory cell. The memory cell comprises a bottom electrode disposed over a substrate. A switching dielectric is disposed over the bottom electrode and having a variable resistance. A top electrode is disposed over the switching dielectric. A hard mask disposed over the top electrode. A sidewall spacer is disposed on an upper surface of the bottom electrode and extended upwardly along sidewalls of the switching dielectric, the top electrode, and the hard mask. The hard mask and the sidewall spacer have different etch selectivity.

In another embodiment, the present disclosure relates to a memory device. The memory device comprises a bottom interconnect structure comprising a bottom metallization line surrounded by a bottom interlayer dielectric (ILD) layer. A bottom electrode via is disposed on the bottom interconnect structure and surrounded by a lower dielectric layer. A bottom electrode is electrically connected to the bottom metallization line by the bottom electrode via. A switching dielectric is disposed over the bottom electrode. A top electrode is disposed over the switching dielectric. A hard mask is disposed over the top electrode. A sidewall spacer extends along sidewalls of the switching dielectric, the top electrode, and the hard mask. A top surface of the sidewall spacer directly contacts the sidewall of the hard mask and is located lower than a top surface of the hard mask.

In yet another embodiment, the present disclosure relates to a method of manufacturing an integrated circuit (IC). The method comprises forming a multi-layer stack comprising a bottom electrode layer, a switching dielectric layer over the bottom electrode layer, a top electrode layer over the switching dielectric layer, and a hard mask layer over the top electrode layer. The method further comprises performing a first series of etch to pattern the hard mask layer, the top electrode layer and the switching dielectric layer to form a hard mask, a top electrode and a switching dielectric. The method further comprises forming a sidewall spacer alongside the hard mask, the top electrode, and the switching dielectric and performing a second series of etch to pattern the bottom electrode layer according to the sidewall spacer to form a bottom electrode. The hard mask layer and the sidewall spacer are formed by different materials The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory cell, comprising:
a bottom electrode disposed over a substrate;
a switching dielectric disposed over the bottom electrode and having a variable resistance;
a top electrode disposed over the switching dielectric;
a hard mask disposed over the top electrode;
a sidewall spacer extending upwardly along sidewalls of the switching dielectric, the top electrode, and the hard mask; and
a top metallization line surrounded by a top interlayer dielectric layer and coupled to the top electrode through a top electrode via;
wherein the hard mask and the sidewall spacer have different etch selectivity;
wherein the top electrode via has a bottom that directly contacts an upper surface of the top electrode and a lower sidewall that directly contacts the sidewall spacer along an interface above the top electrode and below the hard mask.

2. The memory cell of claim 1, wherein the hard mask is made of silicon carbide and the sidewall spacer is made of silicon nitride.

3. The memory cell of claim 1, wherein the hard mask directly contacts the top electrode.

4. The memory cell of claim 1, wherein a top surface of the sidewall spacer directly contacts the sidewall of the hard mask and is located lower than a top surface of the hard mask.

5. The memory cell of claim 1, further comprising:
a bottom metallization line surrounded by a bottom interlayer dielectric layer and coupled to the bottom electrode through a bottom electrode via;
wherein a sidewall of the top electrode via is covered by the top interlayer dielectric layer and the hard mask.

6. The memory cell of claim 5, further comprising:
a lower dielectric layer disposed on the bottom interlayer dielectric layer and surrounding the bottom electrode via; and
a dielectric layer disposed on the lower dielectric layer, along sidewalls of the bottom electrode, the sidewall spacer, and the top electrode via, and overlying the hard mask;
wherein the lower dielectric layer directly contacts the dielectric layer;
wherein the dielectric layer directly contacts the top interlayer dielectric layer.

7. The memory cell of claim 6, wherein a top surface of the hard mask directly contacts the dielectric layer.

8. The memory cell of claim 1, wherein the sidewall spacer is disposed on an upper surface of the bottom electrode, and wherein sidewalls of the switching dielectric and the top electrode are aligned with one another and not aligned with a sidewall of the bottom electrode.

9. A memory device, comprising:
 a bottom interconnect structure disposed over a substrate and comprising a bottom metallization line surrounded by a bottom interlayer dielectric (ILD) layer;
 a bottom electrode via disposed on the bottom interconnect structure and surrounded by a lower dielectric layer;
 a bottom electrode electrically connected to the bottom metallization line by the bottom electrode via;
 a switching dielectric disposed over the bottom electrode;
 a top electrode disposed over the switching dielectric;
 a hard mask disposed over the top electrode;
 a sidewall spacer extending along sidewalls of the switching dielectric, the top electrode, and the hard mask; and
 a top electrode via coupled to the top electrode;
 wherein the top electrode via has a bottom that directly contacts an upper surface of the top electrode and a lower sidewall that directly contacts the sidewall spacer along an interface above the top electrode and below an upper surface of the hard mask.

10. The memory device of claim 9, wherein the sidewall spacer is disposed directly on a top surface of the bottom electrode.

11. The memory device of claim 9, wherein the hard mask and the sidewall spacer have different etch selectivity.

12. The memory device of claim 9, wherein the hard mask is made of silicon carbide and the sidewall spacer is made of silicon nitride.

13. The memory device of claim 9, further comprising:
 a dielectric layer disposed on the lower dielectric layer, along sidewalls of the bottom electrode, the sidewall spacer, and the top electrode via, and overlying the hard mask.

14. The memory device of claim 13, wherein the hard mask directly contacts the top electrode and the dielectric layer.

15. The memory device of claim 13, wherein the lower dielectric layer directly contacts the dielectric layer.

16. The memory device of claim 9, wherein a vertical plane separates a bottom surface of the top electrode via to a first distance reaching the hard mask and a second distance reaching the sidewall spacer, wherein the first distance is greater than the second distance.

17. A memory device, comprising: a multi-layer stack comprising a hard mask, a top electrode, a switching dielectric, and a bottom electrode; a sidewall spacer alongside the hard mask, the top electrode, and the switching dielectric and disposed on the bottom electrode; a dielectric layer overlying the hard mask; and a top electrode via extending through the dielectric layer and the hard mask to reach on the top electrode; wherein the hard mask and the sidewall spacer are formed by different materials;
 wherein the top electrode via has a first outer sidewall that directly contacts the hard mask and has a second outer sidewall that directly contacts the sidewall spacer at a position higher than a bottom surface of the hard mask and lower than a top surface of the hard mask.

18. The memory device of claim 17, wherein the top electrode via has a bottom that directly contacts an upper surface of the top electrode and the second outer sidewall directly contacts the sidewall spacer along an interface above the top electrode and below the top surface of the hard mask.

19. The memory device of claim 17, wherein the hard mask and the sidewall spacer are configured to have an etching rate for an etchant in a range of from 1:3 to 1:10.

20. The memory device of claim 17, wherein the top surface of the hard mask is higher than a top surface of the sidewall spacer.

* * * * *